(12) United States Patent
Liu et al.

(10) Patent No.: US 7,462,542 B2
(45) Date of Patent: Dec. 9, 2008

(54) METHOD OF FABRICATING SEMICONDUCTOR DEVICES AND METHOD OF ADJUSTING LATTICE DISTANCE IN DEVICE CHANNEL

(75) Inventors: Alex Liu, Taipei City (TW); Cheng-Tung Huang, Kaohsiung (TW); Wei-Tsun Shiau, Kaohsiung County (TW); Kuan-Yang Liao, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/936,093

(22) Filed: Nov. 7, 2007

(65) Prior Publication Data
US 2008/0057655 A1 Mar. 6, 2008

Related U.S. Application Data

(62) Division of application No. 10/907,677, filed on Apr. 12, 2005, now abandoned.

(51) Int. Cl.
*H01L 21/8234* (2006.01)
(52) U.S. Cl. .................. 438/275; 438/199; 438/308; 438/938
(58) Field of Classification Search .................. None
See application file for complete search history.

(56) References Cited

U.S. PATENT DOCUMENTS

| | | | |
|---|---|---|---|
| 6,686,617 B2 | 2/2004 | Agnello et al. | |
| 6,984,564 B1 * | 1/2006 | Huang et al. ............... | 438/275 |
| 7,052,946 B2 * | 5/2006 | Chen et al. ................. | 438/199 |
| 7,119,404 B2 * | 10/2006 | Chang et al. ............... | 257/389 |
| 2004/0253791 A1 | 12/2004 | Sun et al. | |
| 2006/0094194 A1 * | 5/2006 | Chen et al. ................. | 438/301 |
| 2006/0099765 A1 * | 5/2006 | Yang .......................... | 438/301 |

FOREIGN PATENT DOCUMENTS

CN 1591860 3/2005

* cited by examiner

*Primary Examiner*—Zandra Smith
*Assistant Examiner*—Khanh B Duong
(74) *Attorney, Agent, or Firm*—Jianq Chyun IP Office

(57) ABSTRACT

A method of fabricating semiconductor devices is provided. A plurality of gate structures is formed over a substrate. A source region and a drain region are formed in the substrate and adjacent to sidewalls of each gate structure. A self-aligned salicide block (SAB) layer is formed over the substrate to cover the gate structures and the exposed surface of the substrate. An anneal process is performed. The SAB layer creates a tension stress during the anneal process so that the substrate under the gate structures is subjected to the tension stress. A portion of the SAB layer is removed to expose a portion of the gate structures and a portion of the surface of the substrate. A salicide process is performed.

12 Claims, 6 Drawing Sheets

METHOD OF FABRICATING SEMICONDUCTOR DEVICES AND METHOD OF ADJUSTING LATTICE DISTANCE IN DEVICE CHANNEL

CROSS-REFERENCE TO RELATED APPLICATION

This application is a continuation application of a prior application Ser. No. 10/907,677, filed on Apr. 12, 2005. The entirety of the above-mentioned patent application is hereby incorporated by reference herein and made a part of this specification.

BACKGROUND OF THE INVENTION

1. Field of the Invention

The present invention relates to a semiconductor process, and more particularly to a method of fabricating a semiconductor device and a method of adjusting a lattice distance in the device channel region.

2. Description of the Related Art

In the early days, a metal-oxide-semiconductor (MOS) device is composed of a metal gate electrode, a gate dielectric layer, and a semiconductor substrate. Because the adhesion of most metals to silicon is unsatisfactory, currently, the material of the gate electrode is polysilicon. The application of a polysilicon gate electrode, however, incurs other issues. For example, the device performance decays due to the high resistance of the polysilicon. Accordingly, with the present technology, after forming the device, a salicide process is performed to form metal silicide on the gate electrode and the source/drain regions to reduce the resistance of the device.

In another aspect, a chip usually comprises a device area and a peripheral circuit area, wherein, devices in the device area include, for example, memory devices, and electro-static discharge (ESD) protection circuits. Devices in the peripheral circuit area comprise, for example, logic devices. The devices in the device area require high resistances than those in the peripheral circuit area. During the salicide process above, a block layer is used to cover the area on which the metal silicide is not going to be formed. Because the area covered by the block layer does not require additional film layer to prevent the formation of metal silicide, the block layer is also called a self-aligned salicide block layer (SAB) layer.

FIGS. 1A-1E are schematic cross sectional views showing the progression of a prior art method of fabricating a semiconductor device. Referring to FIG. 1A, a substrate 100 is provided. The substrate 100 includes a device area 102, and a peripheral circuit area 104. Gate structures 106 and 108 are formed over the substrate 100 of the device area 102 and the peripheral circuit area 104, respectively. Lightly-doped regions 110 and 112 are formed in the substrate 100 and adjacent to the sidewalls of the gate structures 106 and 108.

Referring to FIG. 1B, after forming spacers 114 on the sidewalls of the gate structures 106 and 108, the source regions 116a and 118a, and the drain regions 116b and 118b are formed in the substrate 100 and adjacent to the spacers 114. An anneal process 120 is performed to the source regions 116a and 118a, and the drain regions 116b and 118b.

Referring to FIG. 1C, an SAB layer 122 is formed over the substrate 100, covering the gate structures 106 and 108, and the exposed surface of the substrate 100.

Referring to FIG. 1D, the SAB layer 122 in the peripheral circuit area 104 is removed, and the SAB layer 122a in the device area 102 is reserved. A metal layer 124 is then formed over the substrate 100, covering the SAB layer 122a, the gate electrode 108, and the exposed surface of the substrate 100.

Referring to FIG. 1E, a thermal process is performed so that a portion of the metal layer 124 reacts with silicon under the metal layer 124 to form a metal silicide layer 126. The unreacted metal layer 124 is then removed.

In the process described above, the formation of the metal silicide layer can solve the problem of high resistance of the device. However, when the size of the device shrinks, the lattice distance in the channel region 128 seriously affects the electron mobility. The lattice distance becomes an essential factor in determining the device performance.

SUMMARY OF THE INVENTION

Accordingly, the present invention is directed to a method of fabricating a semiconductor device to improve device performance.

The present invention is also directed to a method of adjusting a lattice distance of a device channel region to enhance electron mobility in the channel region.

The present invention provides a method of fabricating a semiconductor device. The method forms a plurality of gate structures over a substrate. A source region and a drain region corresponding to each gate structure are formed in the substrate and adjacent to the sidewalls of each of the gate structures. A self-aligned salicide block (SAB) layer is formed to cover the gate structures and an exposed surface of the substrate. An anneal process is performed. During the anneal process, the SAB layer creates a tension stress so that the substrate under the gate structures is subject to the tension stress. A self-aligned salicide process is performed.

According to a method of fabricating a semiconductor device of a preferred embodiment of the present invention, the material of the SAB layer includes, for example, a material that creates a tension stress while being heated. The material can be, for example, silicon oxide or silicon nitride. In addition, the thickness of the SAB layer is from about 500 Å to about 5000 Å, for example.

According to a method of fabricating a semiconductor device of an embodiment of the present invention, the source region and the drain region corresponding thereto in the substrate and adjacent to the sidewalls of each of the gate structures are formed by an ion implantation process.

According to a method of fabricating a semiconductor device of a preferred embodiment of the present invention, the anneal process comprises a rapid thermal anneal (RTA) process, for example.

According to a method of fabricating a semiconductor device of an embodiment of the present invention, the step of forming the self-aligned salicide forms a metal layer over the substrate, covering a reserved SAB layer, the gate structure which is exposed, and the exposed surface of the substrate. A thermal process is performed so that a portion of the metal layer reacts to form a salicide layer. The unreacted metal layer is then removed.

The SAB layer of the present invention creates a tension stress which will change the lattice distance in the channel region of the substrate under the gate structure. Accordingly, the electron mobility in the channel region of the substrate under the gate structure is improved. The device performance is also improved. In addition, according to the present invention, a semiconductor process is conducted while the lattice distance is adjusted without additional processes and costs.

The present invention provides a method of adjusting a lattice distance of a device channel. The method provides a substrate with a device formed over the substrate. The device at least comprises a gate structure and a channel region. A lattice adjusting layer is formed to cover the device. A thermal process is performed. During the thermal process, the lattice adjusting layer creates a tension stress so that a lattice distance of the channel region is changed.

According to a method of adjusting a lattice distance of a device channel of a preferred embodiment of the present invention, the material of the lattice adjusting layer comprises a material that creates a tension stress while being heated. The material can be, for example, silicon oxide or silicon nitride. The thickness of the lattice adjusting layer is from about 500 Å to about 5000 Å, for example.

According to a method of adjusting a lattice distance of a device channel of an embodiment of the present invention, the anneal process can be, for example, a rapid thermal anneal (RTA) process.

The lattice adjusting layer of the present invention creates a tension stress during the thermal process so that the tension stress changes the lattice distance of the channel region. Accordingly, the electron mobility in the channel region is improved and the device performance is also enhanced.

The above and other features of the present invention will be better understood from the following detailed description of the preferred embodiments of the invention that is provided in communication with the accompanying drawings.

DESCRIPTION OF SOME EMBODIMENTS

Figure 1A:
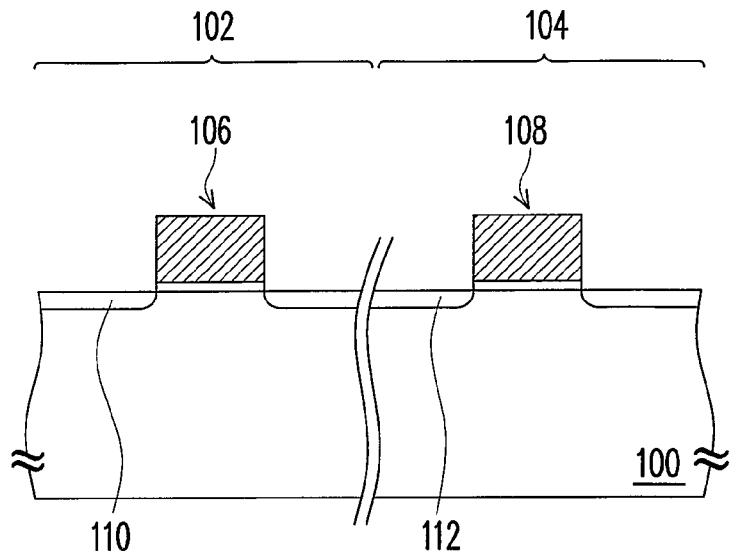
FIGS. 1A-1E are schematic cross sectional views showing the progression of a prior art method of fabricating a semiconductor device.
Figure 1B:
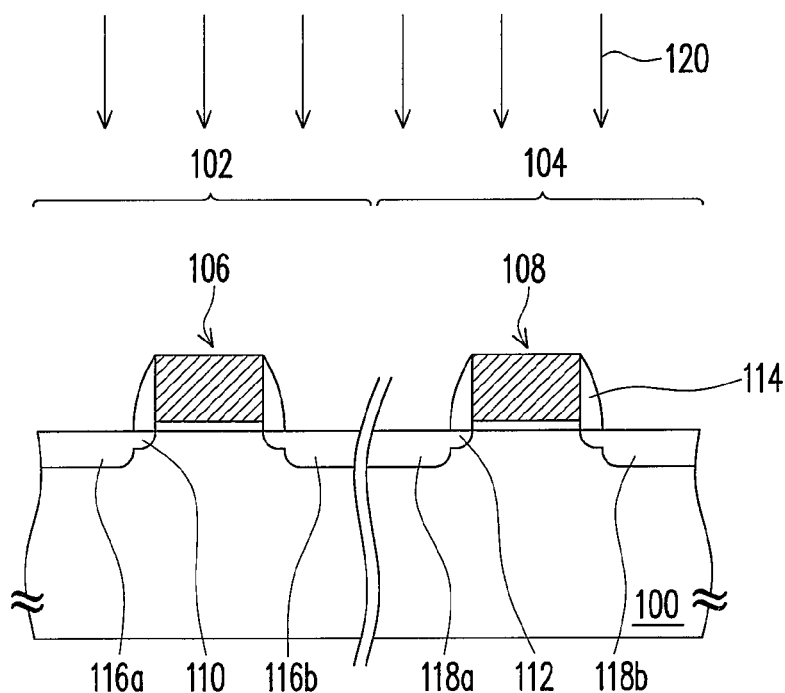
Figure 1C:
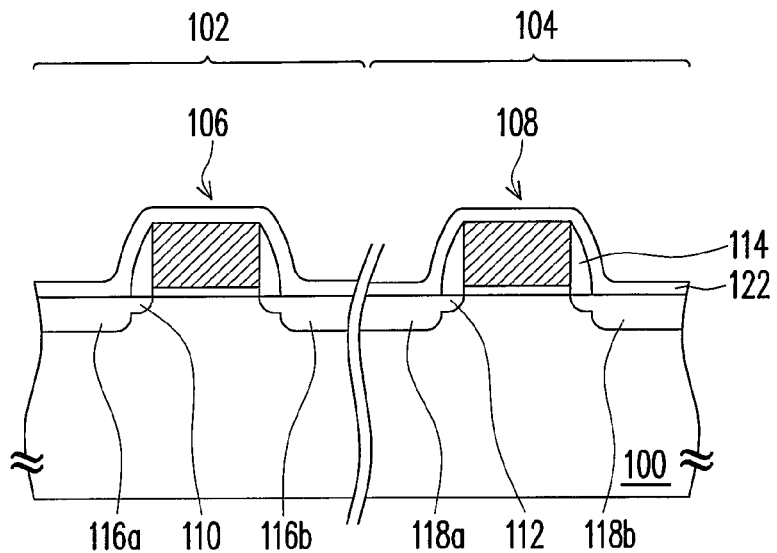
Figure 1D:
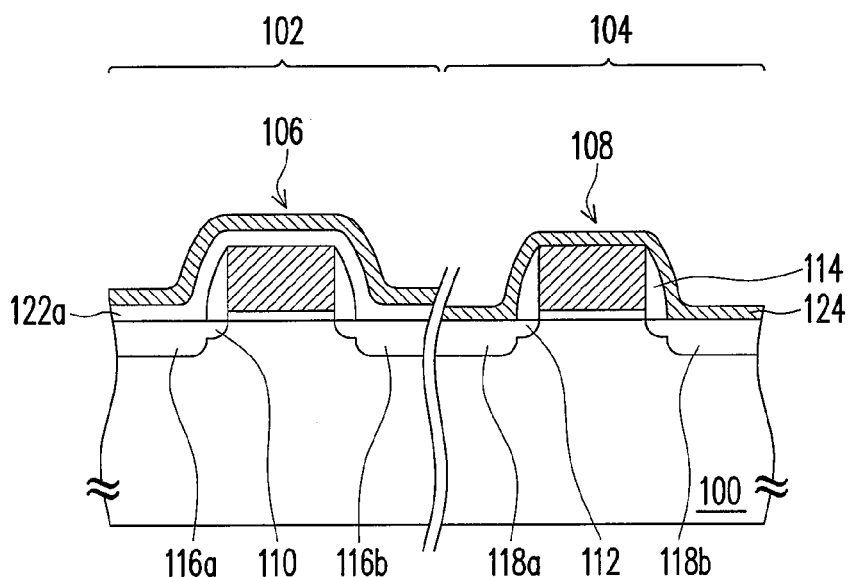
Figure 1E:
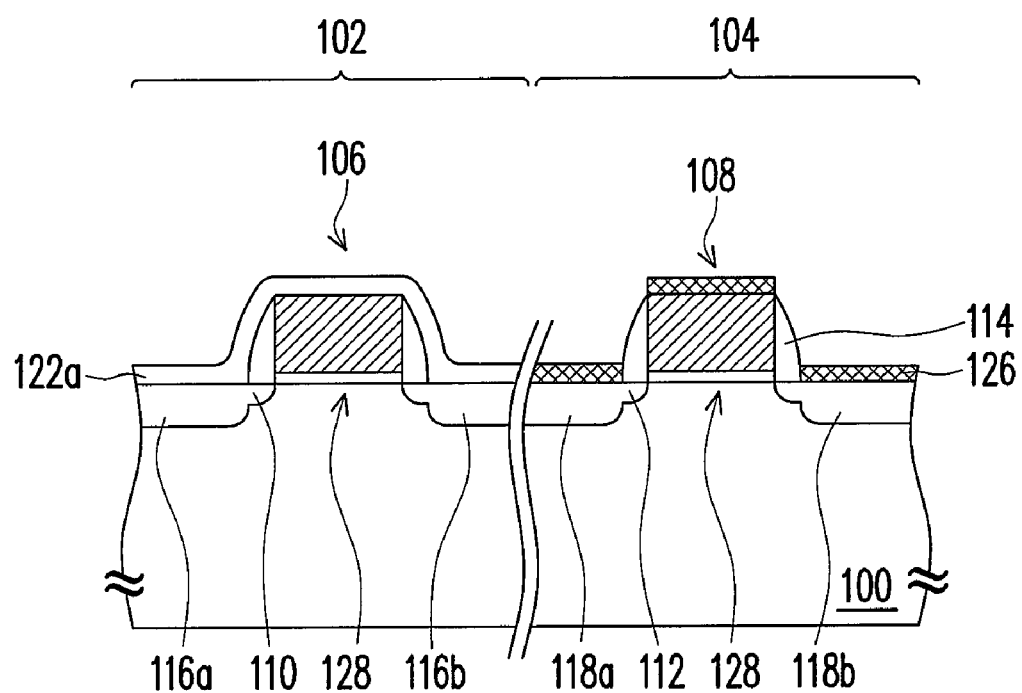
Figure 2A:
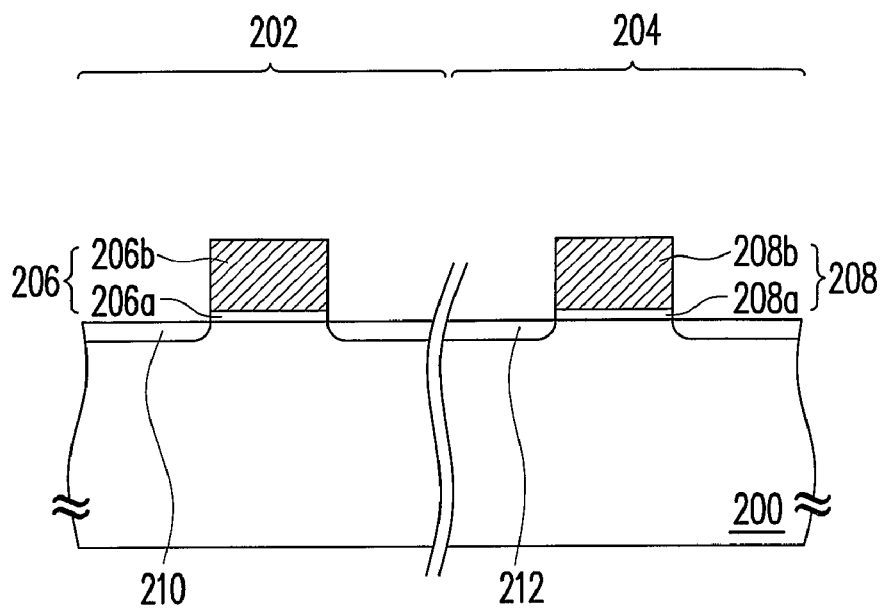
FIGS. 2A-2F are schematic cross sectional views showing the progression of a method of fabricating a semiconductor device according to an embodiment of the present invention.

FIGS. 2A-2F are schematic cross sectional views showing the progression of a method of fabricating a semiconductor device according to a preferred embodiment of the present invention. Referring to FIG. 2A, a substrate 200 is provided. The substrate 200 includes, for example, a device area 202 and a peripheral circuit area 204. Gate structures 206 and 208 are formed over the substrate 200 of the device area 202 and the peripheral circuit area 204, respectively, wherein, the gate structure 206 can be a portion of a memory device or an electro-static discharge (ESD) protection circuit. The gate structure 206 includes the gate dielectric layer 206a and the gate electrode layer 206b. The gate structure 208 can be a portion of a logic device. The gate structure 208 includes the gate dielectric layer 208a and the gate electrode layer 208b. In addition, the material of the gate dielectric layers 206a and 208a can be, for example, silicon oxide. The material of the gate electrode layers 206b and 208b can be polysilicon, for example.

Lightly-doped drain regions 210 and 212 are formed in the substrate 200 and adjacent to sidewalls of the gate structures 206 and 208, wherein, the method of forming the lightly-doped drain regions 210 and 212 can be, for example, an ion implantation process. Note that, in the process of forming the lightly doped regions 210, the crystal phase of the gate structure 206 and 208 may change due to the use of the ion implantation process. For example, the crystal phase of portions of the gate structures 206b and 208b changes from polysilicon to amorphous silicon due to the use of the ion implantation process.

Figure 2B:
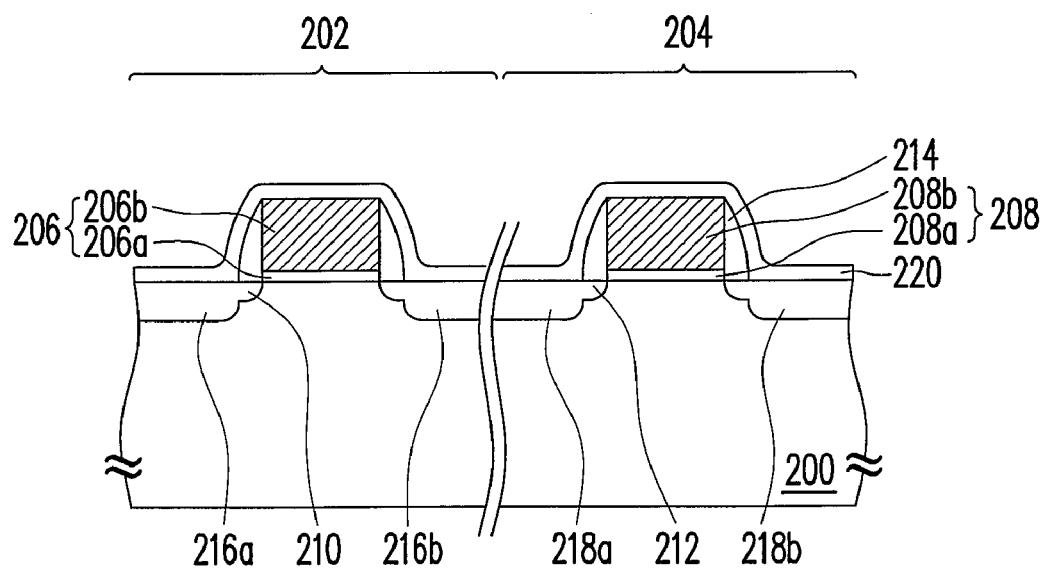

Referring to FIG. 2B, spacers 214 are formed on the sidewalls of the gate structures 206 and 208. The material of the spacers 214 can be, for example, silicon nitride, silicon oxide, silicon oxynitride or other suitable materials. In addition, the method of forming the spacers 214 includes first forming a spacer material layer (not shown) covering the gate structures 206 and 208 and the exposed surface of the substrate 200. An anisotropic etch process is performed to remove the spacer material layer on the tops of the gate structures 206 and 208 and on the surface of the substrate 200.

Source regions 216a and 218a and drain regions 216b and 218b are formed in the substrate 200 and adjacent to the spacers 214 of the gate structures 206 and 208. The method of forming the source regions 216a and 218a and the drain regions 216b and 218b can be, for example, an ion implantation process. During the step of forming the source regions 216a and 218a and the drain regions 216b and 218b, the crystal phase of the gate structures 206 and 208 may change due to the use of the ion implantation process. For example, the crystal phase of portions of the gate structures 206b and 208b changes from polysilicon to amorphous silicon due to the use of the ion implantation process.

In another embodiment, the step of forming the lightly-doped drain regions 210 and 212 can be omitted, and the source regions 216a and 218a and the drain regions 216b and 218b are directly formed in the substrate 200 and adjacent to the sidewalls of the gate structures 206 and 208. Then, the spacers 214 are formed on the sidewalls of the gate structures 206 and 208.

Referring to FIG. 2B, a self-aligned salicide block (SAB) layer 220 is formed over the substrate, covering the gate structures 206 and 208, the spacers 214 and the exposed surface of the substrate 200. The material of the SAB layer 220 can be, for example, a material that creates a tension stress while being heated. The material can be, for example, silicon oxide, or silicon nitride. The thickness of the SAB layer is from about 500 Å to about 5000 Å, for example. The method of forming the SAB layer can be, for example, a chemical vapor deposition (CVD) process.

Figure 2C:
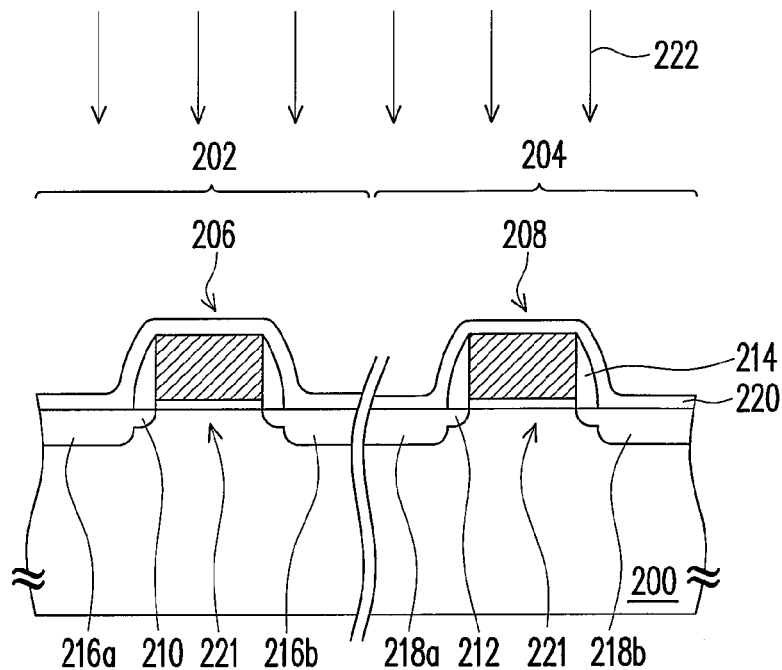

Referring to FIG. 2C, an anneal process 222 is performed. The anneal process 222 repairs the damage of the lattice in the source regions 216a and 218a and the drain regions 216b and 218b due to the ion implantation process. The anneal process also repairs the crystallinity in the gate electrodes 206b and 208b to change from amorphous silicon to polysilicon. The anneal process 222 can be a rapid thermal anneal (RTA) process, for example.

Note that, during the anneal process 222, the SAB layer 220 creates a tension stress. The tension stress will change the lattice distance in the substrate 200 under the gate structures 206 and 208. In detail, after forming the SAB layer 220, the SAB layer 220 creates the tension stress due to the anneal process 220. The tension stress affects the lattice distance in the channel region 221 through the gate structures 206 and 208. By using the SAB layer 220, such as silicon oxide or silicon nitride, in which a high tension stress is created while being heated, during the anneal process 222, the tension stress will increase the lattice distance in the channel region 221. The electron mobility in the channel region 221 is thus enhanced. The device performance is also improved.

Figure 2D:
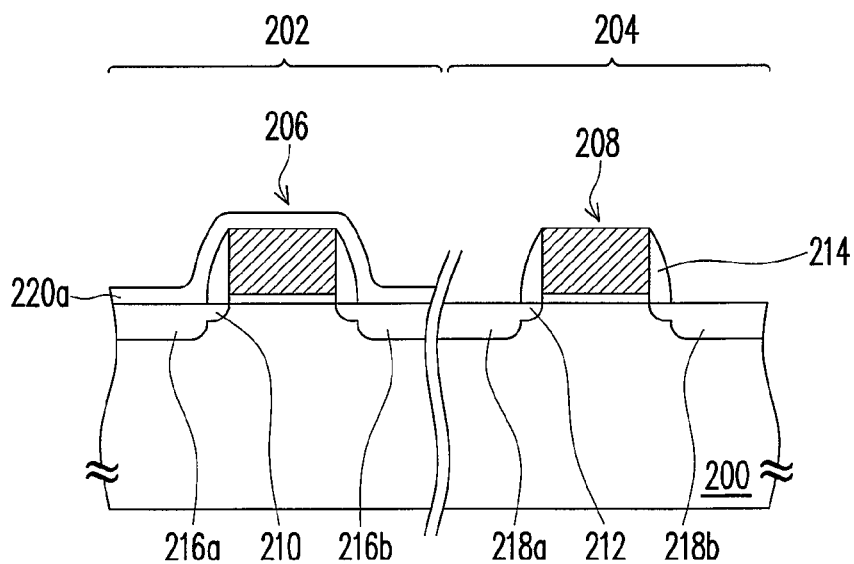

Referring to FIG. 2D, the SAB layer 220 of the peripheral circuit region 204 is removed to expose the gate structure 208 and a portion of the surface of the substrate 200, while the SAB layer 220a in the device area 202 is reserved. Note that the SAB layer 220 in the peripheral circuit area 204 is removed because devices in the peripheral circuit area 204 require low resistances. In other words, the subsequent self-aligned salicide process can reduce the resistances of the devices in the peripheral circuit area 204. In another aspect, devices in the device area 202, however, do not require such low resistances. The SAB layer 220a thus is used to cover the device area 202 to prevent the subsequent self-aligned salicide process from performing on the device area 202.

Figure 2E:
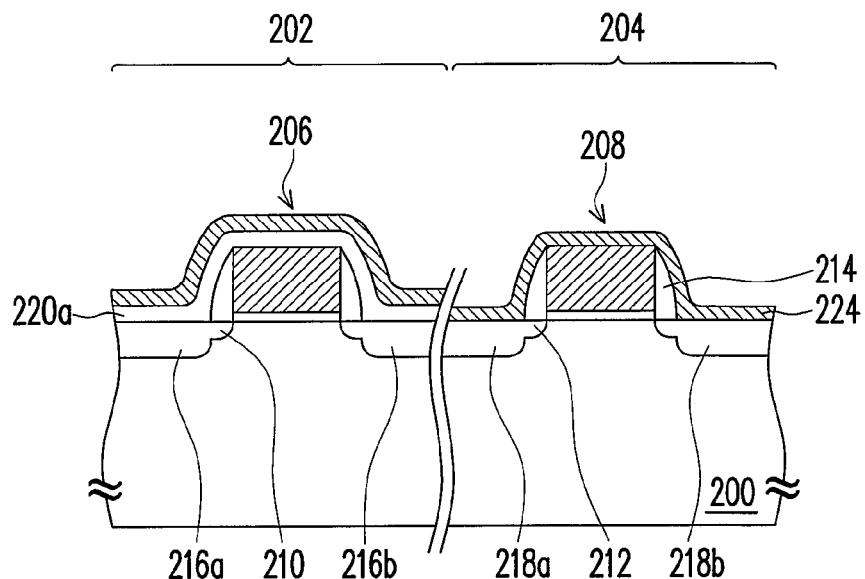

The self-aligned salicide process is then performed. Referring to FIG. 2E, a metal layer 224 is formed over the substrate 200, covering the SAB layer 220a, the gate structure 208 and the exposed surface of the substrate 200. The material of the metal layer 224 can be, for example, tungsten, titanium or other suitable materials. The method of forming the metal layer 224 can be, for example, a CVD method, physical vapor deposition (PVD) method, or other suitable processes.

Figure 2F:
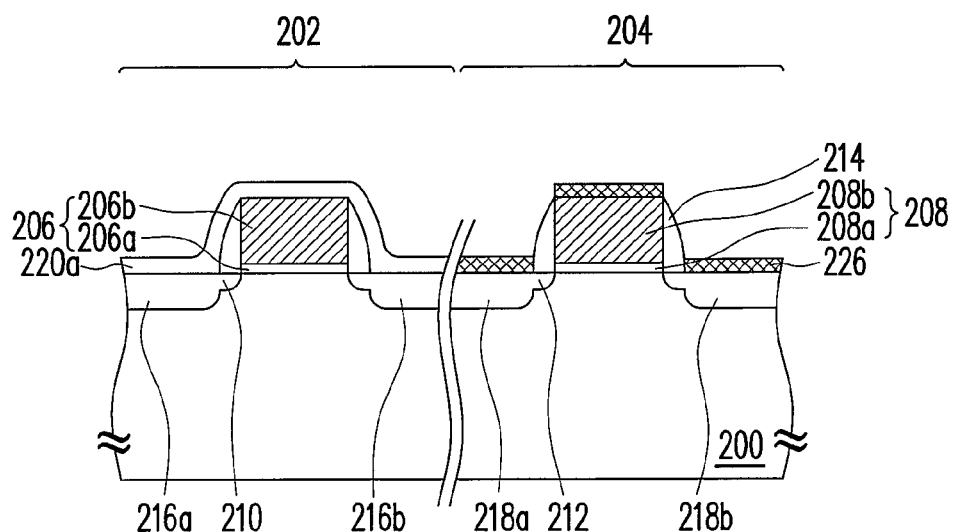

Referring to FIG. 2F, a thermal process is performed so that a portion of the metal layer 224 reacts with the silicon under the metal layer 224 to form a salicide layer 226. In the thermal process described above, the metal layer 224 reacts with silicon in other film layers contacting with the metal layer 224 to form the salicide layer 226. The film layer can include, for example, the gate electrode 208a, and the source region 218a and the drain region 218b in the substrate 200. The SAB layer 220a covers the device area 202. The metal layer 224 does not react with the device area 202, and no salicide layer is formed. The film on the SAB layer 220a still is the metal layer 224.

The unreacted metal layer 224 is then removed. The removal method can be, for example, an etch process. The etch process has different etch selectivity to the SAB layer 220a and the metal layer 224.

Accordingly, the present invention comprises following advantages.

1. The SAB layer of the present invention creates a tension stress during anneal process. The tension stress changes the lattice distance in the substrate under the gate structure. Accordingly, the electron mobility in the channel region in the substrate under the gate structure is improved. The device performance is also enhanced.

2. While performing the semiconductor process, the method of the present invention also adjusts the lattice distance. Accordingly, no additional process and costs are required.

3. The embodiment described above is an application of the present invention to adjust the lattice distance in the device channel region. The present invention is not limited thereto. In the method of adjusting the lattice distance in the device channel region, only one lattice adjusting layer covers the devices. During the thermal process, the lattice adjusting layer creates the tension stress which changes the lattice distance in the device channel region. The electron mobility in the channel region is thus improved and the device performance is also enhanced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of fabricating a semiconductor device, comprising:
   a) providing a substrate having a first device area and a second device area;
   b) forming a plurality of gate structures over the substrate both in the first device area and the second device area;
   c) forming a source region and a drain region in the substrate and adjacent to sidewalls of each of the gate structures;
   d) forming a self-aligned salicide block (SAB) layer on the substrate and covering the gate structures;
   e) performing an anneal process directly after the step d) to make the SAB layer create a tension stress so that the substrate under the gate structures is subjected to the tension stress;
   f) removing a portion of the SAB layer to expose the gate structures and a portion of the surface of the substrate in the second device area; and
   g) performing a self-aligned silicide process to form a silicide layer on the gate structures, the source regions, and the drain regions in the second device area, wherein the surface of the gate structures, the source regions, and the drain regions in the first device area is still covered by the SAB layer without silicide layer.

2. The method of fabricating the semiconductor device of claim 1, wherein the SAB layer comprises a material that creates the tension stress while being heated.

3. The method of fabricating the semiconductor device of claim 2, wherein the material is silicon oxide or silicon nitride.

4. The method of fabricating the semiconductor device of claim 1, wherein a thickness of the SAB layer is from about 500 Å to about 5000 Å.

5. The method of fabricating the semiconductor device of claim 1, wherein the step of forming the source region and the drain region in the substrate and adjacent to the sidewalls of each of the gate structures comprises performing an ion implantation process.

6. The method of fabricating the semiconductor device of claim 1, wherein the anneal process comprises a rapid thermal anneal (RTA) process.

7. The method of fabricating the semiconductor device of claim 1, wherein the step of forming the self-aligned suicide comprises:
   forming a metal layer over the substrate, covering a reserved SAB layer, the exposed gate structures, and the exposed portion of the surface of the substrate in the second device area;
   performing a thermal process so that a portion of the metal layer reacts to form a salicide layer; and
   removing the metal layer that does not react.

8. A method of adjusting a lattice distance of a device channel, comprising:
   a) providing a substrate having a peripheral circuit area and a device area;
   b) forming a plurality of devices on the substrate, each of the devices comprising a gate structure and a channel region;
   c) forming a lattice adjusting layer covering the devices;
   d) performing a thermal process directly after the step c), wherein during the thermal process the lattice adjusting layer creates a tension stress so that the tension stress changes a lattice distance of the channel region;
   e) removing a portion of the lattice adjusting layer to expose the gate structures and a portion of the surface of the substrate in the peripheral circuit area;
   f) forming a metal layer covering the lattice adjusting layer in the device area and the exposed gate structure and substrate in the peripheral circuit area;
   g) performing a rapid thermal process to form a suicide layer in the peripheral circuit area; and
   h) removing the metal layer on the lattice adjusting layer in the device area, wherein the devices of the device area are strained by the lattice adjusting layer without forming silicide layer.

9. The method of adjusting the lattice distance of the device channel of claim 8, wherein the device area comprising ESD circuit.

10. The method of adjusting the lattice distance of the device channel of claim 8, wherein the device area comprising memory device.

11. The method of adjusting the lattice distance of the device channel of claim 8, wherein a material of the lattice adjusting layer is silicon oxide or silicon nitride.

12. The method of adjusting the lattice distance of a device channel of claim 8, wherein a thickness of the lattice adjusting layer is from about 500 Å to about 5000 Å.

* * * * *